US007808276B2

(12) United States Patent
Ciccarelli et al.

(10) Patent No.: US 7,808,276 B2
(45) Date of Patent: Oct. 5, 2010

(54) CHIP-TO-CHIP COMMUNICATION SYSTEM AND METHOD

(75) Inventors: Luca Ciccarelli, Rimini (IT); Luca Magagni, Bologna (IT); Alberto Fazzi, Finale Emilia (IT); Roberto Canegallo, Rimini (IT); Roberto Guerrieri, Bologna (IT)

(73) Assignee: STMicroelectronics S.R.L., Agrate Brianza (MI) (IT)

( * ) Notice: Subject to any disclaimer, the term of this patent is extended or adjusted under 35 U.S.C. 154(b) by 56 days.

(21) Appl. No.: 11/519,444

(22) Filed: Sep. 11, 2006

(65) Prior Publication Data

US 2007/0092011 A1    Apr. 26, 2007

(30) Foreign Application Priority Data

Sep. 9, 2005    (EP)    ................... 05019644

(51) Int. Cl.
H03K 19/094    (2006.01)
(52) U.S. Cl. .............................. 326/83; 326/86; 326/96; 326/98
(58) Field of Classification Search ............. 326/93–98; 710/106, 110, 305; 327/200–202
See application file for complete search history.

(56) References Cited

U.S. PATENT DOCUMENTS 5,818,112 A    10/1998    Weber et al.

| 6,337,581 | B1 * | 1/2002 | Kanetani et al. | 326/83 |
| 6,916,719 | B1 | 7/2005 | Knight et al. | |
| 6,972,596 | B1 * | 12/2005 | Proebsting et al. | 326/83 |
| 2003/0212830 | A1 * | 11/2003 | Greenblat et al. | 709/251 |
| 2005/0040873 | A1 * | 2/2005 | Wada et al. | 327/215 |

OTHER PUBLICATIONS

European Search Report, EP05019644, Mar. 27, 2006.
Drost, Robert J., et al., Proximity Communication, IEEE Journal of Solid-State Circuits, vol. 39, No. 9, pp. 1529-1535, Sep. 2004.
Liu, Huan-Chang, et al., A Low-Power Baseband Receiver IC for Frequency-Hopped Spread Spectrum Communications, IEEE Journal of Solid-State Circuits, vol. 31, No. 3, pp. 384-394, Mar. 1, 1996.
Banerjee et al. (2001) "3-D ICs: A Novel Chip Design for Improving Deep-Submicrometer Interconnect Performance and Systems-on-Chip Integration"; Proceedings of the IEEE; 89(5):602.
Kanda et al. (2003) "1.27Gb/s/pin 3mW/pin wireless superconnect wsc interface scheme"; ISSCC Dig. Tech. Papers; pp. 186-187.

* cited by examiner

*Primary Examiner*—Rexford N Barnie
*Assistant Examiner*—Jany Tran
(74) *Attorney, Agent, or Firm*—Lisa K. Jorgenson; Paul F. Rusyn; Graybeal Jackson LLP (57) ABSTRACT

Embodiments of the invention relate to a chip-to-chip communication system including a transmitter and a receiver connected to receive respective transmitter and receiver clock signals. The transmitter includes precharge and evaluation blocks connected to each other and to a transmitter clock terminal. The receiver includes a precharge block connected to a receiver clock terminal. The precharge blocks precharge an output terminal of the transmitter and an input terminal of the receiver, respectively, to a value corresponding to a first voltage reference during a low phase of the transmitter clock signal.

45 Claims, 5 Drawing Sheets

CHIP-TO-CHIP COMMUNICATION SYSTEM AND METHOD

PRIORITY CLAIM

The present application claims the benefit of European Patent Application No. 05/019,644.3, filed Sep. 9, 2005, which application is incorporated herein by reference in its entirety.

TECHNICAL FIELD

Embodiments of the present invention relate generally to a chip-to-chip communication system.

Embodiments of the invention particularly, but not exclusively, relate to a chip-to-chip communication system for a stacked device, i.e., a device comprising at least two chips assembled in a three-dimensional (3D) stacking configuration and the following description is made with reference to this field of application for convenience of explanation only.

BACKGROUND

As it is well known, the development of stacking technology for heterogeneous device integration has recently increased in importance.

Stacking of chips, in which two or more integrated circuits or ICs of different types are placed one on the top of the other in the same package, is an alternative to silicon integration and provides improvements at the system design level in terms of size, cost, speed, power consumption and ease of application for a wide variety of product.

However, a successful implementation of the stacking or 3D technology requires dealing with state-of-the-art of assembly processes such as wafer back-grinding, handling, die attach, wirebond and alignment. So, the choice of a stacking or 3D technology depends largely on the application of the final chip so obtained.

A correct and enhanced chip-to-chip communication in a stacked device is a fundamental feature to be guaranteed in stacked devices in the scenario of the so-called Systems-on-Chip and Systems-in-Package.

In fact, stacking integrated circuits or silicon structures inside the same package and making them communicate can enhance the performance of a digital system comprising such structures as a whole, as described in the article to Kaustav B. et al.: "3-D ICs: A Novel Chip Design for Improving Deep-Submicrometer Interconnect Performance and Systems-on-Chip Integration", Proceedings of the IEEE, 89(5):602-633, May 2001.

Moreover, vertical data communication using AC wireless interconnect has been recently presented as a very promising stacking or 3D technology for high-bandwidth, high speed applications, as described in the article to Kanda K. et al. entitled "1.27 Gb/s/pin 3 mW/pin wireless superconnect wsc interface scheme", ISSCC Dig. Tech. Papers, pp. 186-187, February 2003.

Also known from the article to R. J. Drost et al.: "Proximity Communication", IEEE J. Solid-State Circuits, 39(9):1529-1535, September 2004, is a prototype based on vertical communication.

A chip-to-chip vertical communication system, as described in the above referred articles, is based on contactless 10 schemes exploiting capacitive coupling as an inter-chip channel. In particular, an upper metal layer of a technology process manufacturing the system is used to form a capacitive channel, as shown for instance in FIG. 1, the chip-to-chip vertical communication system being globally indicated at 1 and hereinafter called briefly the system 1.

Figure 1:
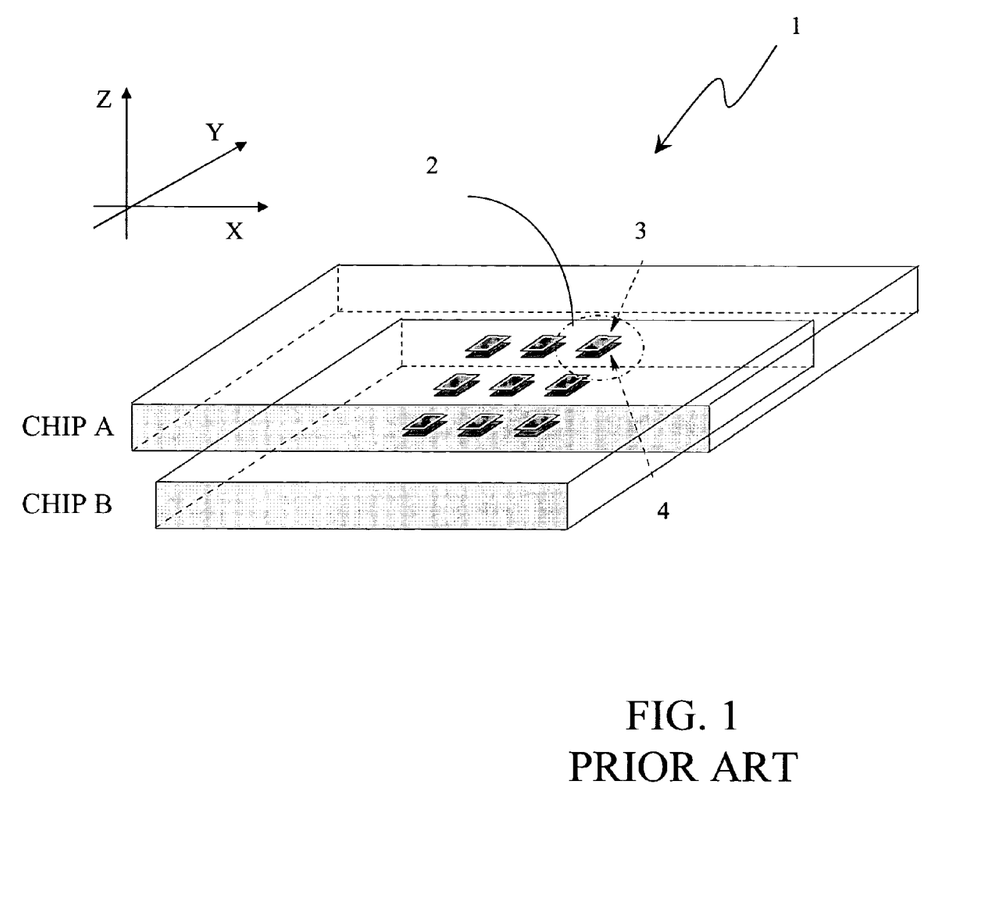
FIG. 1 schematically shows a chip-to-chip vertical communication system realized according the prior art.

As shown in FIG. 1, the system 1 comprises a plurality of communication units 2, each comprising a transmitter 3 and a receiver 4.

In particular, the transmitter 3 resides on a first chip A and the receiver 4 resides on a second chip B, the first and second chip A and B being assembled in a stacked or 3D configuration, the first chip A being on the top of chip B and the transmitter 3 and the receiver 4 being positioned on respective facing surfaces of the chips A and B, more particularly the transmitter 3 on a bottom surface of the chip A and the receiver 4 on a top surface of the chip B, with reference to an XYZ axis-system as shown in FIG. 1. Obviously, the above configuration (transmitter 3-chip A; receiver 4-chip B) is considered only as an example, a reverse configuration (transmitter 3-chip B; receiver 4-chip A) being also possible, the same consideration applying.

It should be emphasized that this approach requires on-chip communication circuits able to guarantee high performance, low power dissipation and reliable flexibility in data exchange.

The known communication circuits are substantially based on very simple driver models, but require sense-amplifiers and biasing blocks for the generation of internal voltage values, in particular in the receiver 4. So, these known communication circuits show a great power consumption due to short-circuit currents.

One technical problem underlying embodiments of the present invention is that of providing a chip-to-chip communication system having structural and functional characteristics which overcomes the limits which still affect the devices realized according to the prior art.

SUMMARY

An embodiment of the present invention is that of providing precharge and evaluation blocks within the transmitter and the receiver of the system having clock signals derived from a common clock signal.

Another embodiment of the present invention is directed to a system of the type comprising at least a transmitter TX and a receiver RX, inserted between first and second voltage references and connected to respective transmitter and receiver clock terminals wherein respective transmitter and receiver clock signals are applied, the transmitter TX having an input terminal receiving an input data and an output terminal connected to an input terminal of the receiver RX at a connection block, the receiver RX having an output terminal issuing an output signal.

The characteristics and advantages of the chip-to-chip communication system according to the invention will be apparent from the following description of embodiments thereof given by way of indicative and non limiting example with reference to the annexed drawings.

DETAILED DESCRIPTION

The following discussion is presented to enable a person skilled in the art to make and use the invention. Various modifications to the embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

With reference to such figures, and in particular to FIGS. 2A and 2B, a chip-to-chip vertical communication system according to an embodiment of the present invention is shown, globally indicated at 10, hereinafter briefly called the system 10.

The system 10 comprises a transmitter TX 11 and a receiver RX 12, connected to each other through a connection block 15. The connection block 15 is an inter-chip communication channel.

In particular, the transmitter TX 11 has an output terminal TXout connected to an input terminal RXin of the receiver RX 12.

Figure 2A:
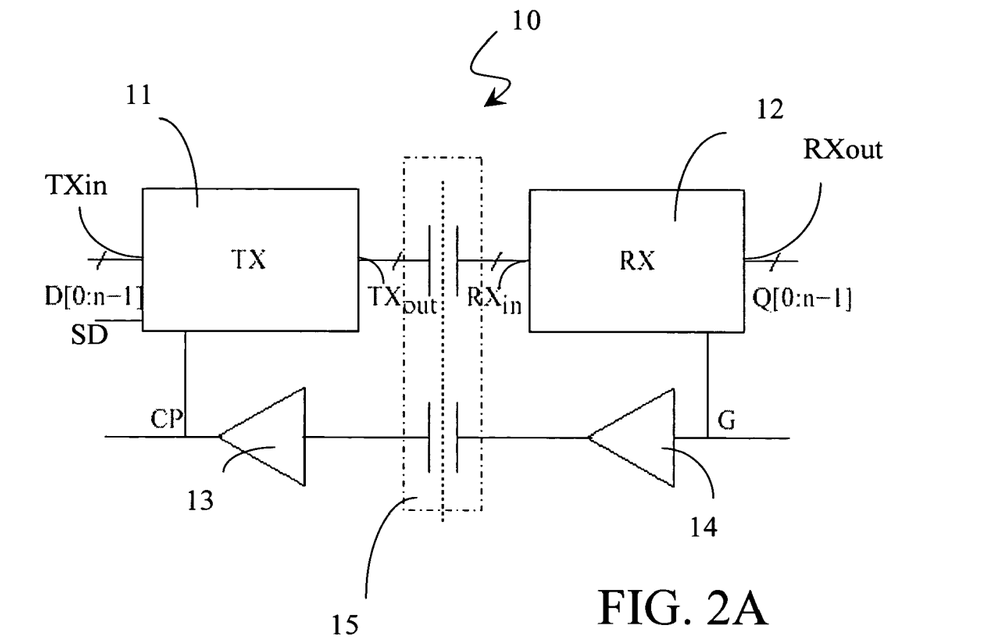
FIGS. 2A and 2B schematically show a chip-to-chip vertical communication system according to an embodiment of the invention with different connection modes.
Figure 2B:
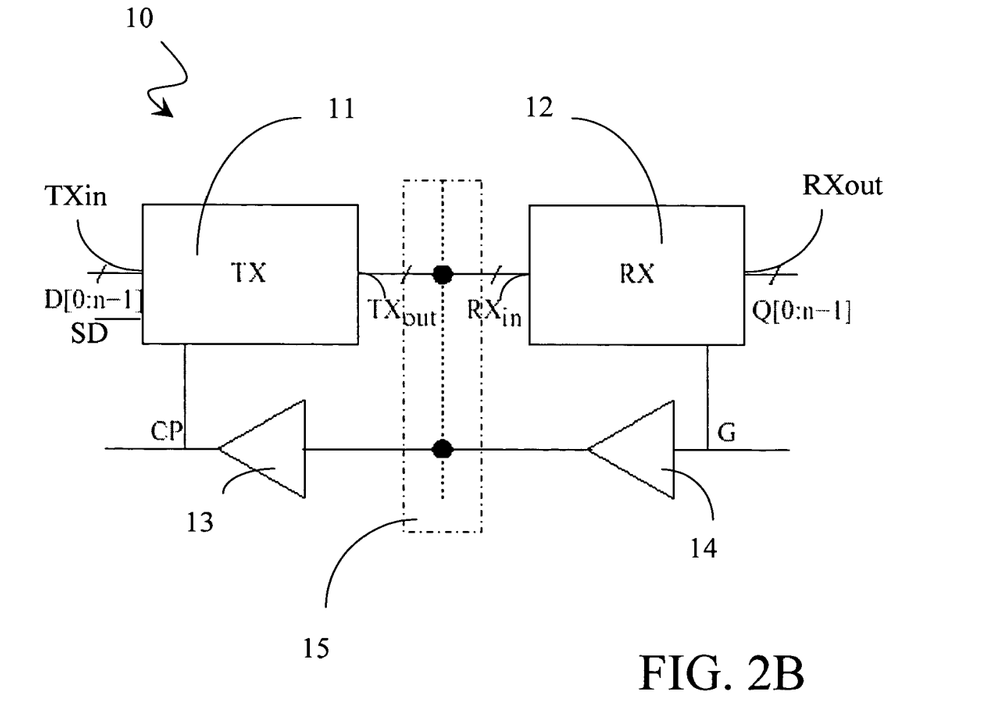

The connection block 15 could be a capacitive connection block, as shown in FIG. 2A or an ohmic connection block, as shown in FIG. 2B.

The transmitter TX 11 also has an input terminal TXin receiving an input signal or data D. In a similar manner, the receiver RX 12 also has an output terminal RXout issuing an output signal Q. In particular, the input data D and the output signal Q are n-bit digital signals.

Furthermore, the receiver RX 12 is connected to a first terminal G, the reference G being indifferently used to indicate the terminal or the signal applied thereto, for sake of simplicity of description. In particular, G is the primary clock signal/terminal.

Also, the transmitter TX 11 is connected to a second terminal CP as well as to a third terminal SD, also in this case the references CP and SD being indifferently used to indicate the terminals or the signals applied thereto, for sake of simplicity of description. In particular, CP is the secondary clock signal/terminal and SD is the preset signal/terminal.

The first and second control terminals are connected to each other at the connection block 15 through a first 13 and a second buffer 14.

In particular, the transmitter TX 11 is associated with a first chip, conventionally indicated as chip A, referring back to FIG. 1 described with reference to the prior art solutions, while the receiver RX 12 is associated with a second chip, conventionally indicated as chip B, the first A and second chip B being assembled in a stacked or 3D configuration.

Advantageously according to an embodiment of the present invention, the primary clock signal G and the secondary clock signal CP are balanced clock trees used to synchronize a bus of the input data D. In particular, the primary clock signal G and the secondary clock signal CP are obtained by the same clock signal. In the example shown in FIGS. 2A and 2B, the secondary clock signal CP is the transmitter clock signal which is delayed with respect to the primary clock signal G which is the receiver clock signal. In this way, the secondary clock signal CP guarantees a correct functional synchronization between the transmitter 11 and the receiver 12, i.e. between the chips A and B. In order to achieve that, the clock signal is transmitted in the opposite direction of the data signal D, i.e. from the data receiver chip B to the data transmitter chip A.

So, advantageously according to an embodiment of the invention, the input data D flows from the first chip A to the second chip B, while the clock signals CP and G flows from the second chip B to the first chip A. In summary, the input data D and the clock signals CP and G flow in opposite directions.

This intentional inversion in the signals flowing is used to exploit a delay due to a clock channel, as it will be clear from the following description of the transmitter TX 11 and receiver RX 12 architectures.

In particular, advantageously according to an embodiment of the invention, both the transmitter TX 11 and the receiver RX 12 are dynamically implemented according to a precharge/evaluation mechanism in order to precharge the output terminal TXout of the transmitter TX 11 and the input terminal RXin of the receiver RX 12 to a value corresponding to a supply voltage reference during a low phase of the secondary clock signal CP. In this way, if a '0' logic signal is to be evaluated, a falling edge of an output signal of the output terminal TXout of the transmitter TX 11 should occur after an evaluation phase of the receiver RX 12 is started, this displacement being assured by the above indicated clock propagation.

Figure 3A:
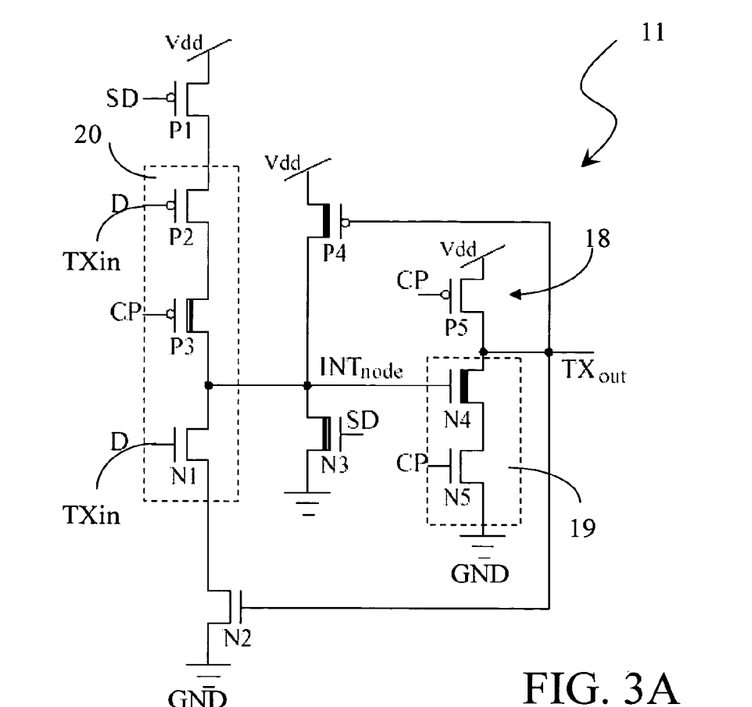
FIGS. 3A and 3B schematically show a transmitter comprised in the system according to an embodiment of the present invention (possible electric implementation and general purpose block diagrams, respectively)
Figure 3B:
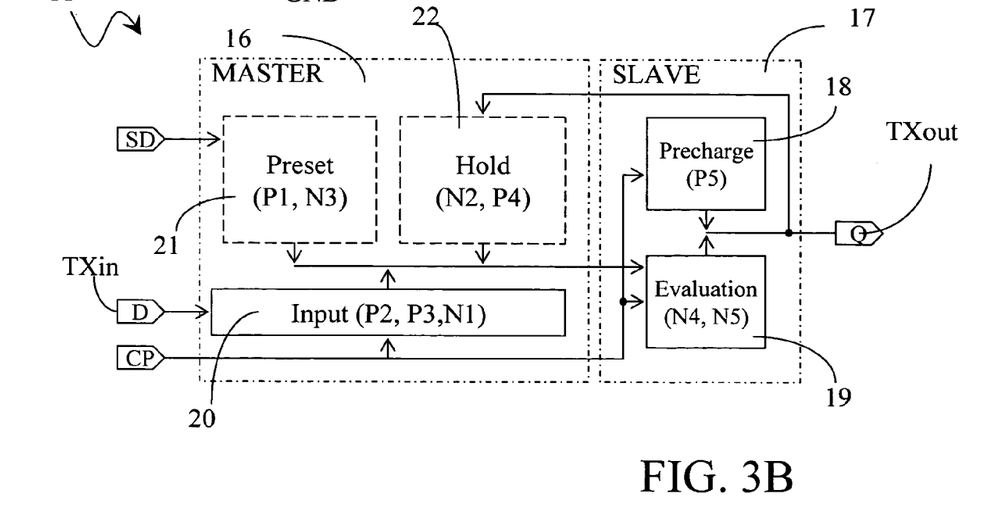

The transmitter TX 11 according to an embodiment of the present invention is shown in greater details in FIGS. 3A and 3B.

In particular, referring to the schematic form of FIG. 3B, the transmitter TX 11, advantageously according to an embodiment of the present invention, comprises a master section 16 and a slave section 17, connected, in cascade to each other, between the input terminal TXin and the output terminal TXout. Advantageously according to this embodiment of the invention, both master 16 and slave section 17 receive the secondary clock signal CP. The master section 16 also receives the input data D and the preset signal SD.

More particularly, the slave section 17 comprises at least a precharge block 18 connected to an evaluation block 19 and to the output terminal TXout. The precharge block 18 and the evaluation block 19 are also connected to the secondary clock terminal CP.

The master section 16 in turn comprises an input block 20, connected to the input terminal TXin and to the slave section 17, in particular to both the precharge block 18 and the evaluation block 19.

The output terminal TXout is also connected in a feedback manner to the master section 16.

In the transmitter TX 11 according to an embodiment of the present invention, the master section 16 also comprises a preset block 21 connected to the preset signal SD and to the evaluation block 19 of the slave section 17.

In absence of this preset block 21, it being advantageous that the preset signal SD is synchronous, it is possible to obtain a preset value on the output terminal TXout acting directly on the input data terminal D.

According to yet another preferred embodiment of the present invention, the master section 16 of the transmitter TX 11 further comprises a hold block 22 connected to the input block 20 as well as to the output terminal TXout. The hold block 22 guarantees the correct working of the transmitter TX 11 also at very low frequencies.

FIG. 3A shows a possible implementation of the transmitter TX 11 of FIG. 3B.

The transmitter TX 11 comprises a first P1, a second P2 and a third transistors P3, of a first type, in particular P-channel MOS or PMOS transistors, as well as a first N1 and a second transistors N2 of a second type, in particular N-channel MOS or NMOS transistors, inserted in series to each other between a first voltage reference, in particular a supply voltage reference Vdd, and a second voltage reference, in particular a ground GND.

The first PMOS transistor P1 has a control terminal connected to the preset terminal SD, the second PMOS transistor P2 and the first NMOS transistor N1 have their control terminals connected to the input terminal TXin and the third PMOS transistor P3 has a control terminal connected to the secondary clock terminal CP, the third PMOS transistor P3 and the first NMOS transistor N1 being interconnected at an internal node INTnode.

In this way, the second P2 and third PMOS transistors P3 and the first NMOS transistor N1 form the input block 20 of the master section 16 of the transmitter TX 11.

Furthermore, the second NMOS transistor N2 has a control terminal connected to the output terminal TXout.

The internal node INTnode is also connected by a third NMOS transistor N3 to ground GND and by a fourth PMOS transistor P4 to the supply voltage reference Vdd. The third NMOS transistor N3 has a control terminal connected to the preset terminal SD, while the fourth PMOS transistor P4 has a control terminal connected to the output terminal TXout.

In this way, the first PMOS transistor P1 and the third NMOS transistor N3 form the preset block 21 of the master section 16 of the transmitter TX 11, while the fourth PMOS transistor P4 and the second NMOS transistor N2 form the hold block 22 of the master section 16 of the transmitter TX 11, corresponding to the transmitter TX 11 according to preferred embodiments of the present invention.

The transmitter TX 11 also comprises a fourth N4 and a fifth NMOS transistors N5 inserted, in series to each other, between the output terminal TXout and ground GND, the fourth transistor N4 having a control terminal connected to the internal node INTnode and the fifth transistor N5 having a control terminal connected to the secondary clock terminal CP.

In this way, the fourth N4 and fifth NMOS transistors N5 form the evaluation block 19 of the slave section 17 of the transmitter TX 11.

Finally, the transmitter TX 11 comprises a fifth PMOS transistor P5 inserted between the voltage supply reference Vdd and the output terminal TXout, the fifth PMOS transistor P5 having a control terminal connected to the secondary clock terminal CP.

In this way, the fifth PMOS transistor P5 forms the precharge block 18 of the slave section 17 of the transmitter TX 11.

In a preferred embodiment of the present invention, the third N3 and fourth NMOS transistors N4 as well as the third P3 and fourth PMOS transistors P5 are high-threshold MOSFET transistors, used to reduce the injection of leakage current, while the first N1 and the fifth NMOS transistors N5 as well as the first P1, second P2 and the fourth PMOS transistors P5 are low-threshold MOSFET transistors, used to high speed communication.

Advantageously according to an embodiment of the invention, the transmitter TX 11 is substantially based on a two-stage dynamic scheme where the output terminal TXout is precharged to the value of the supply voltage reference Vdd when the secondary clock signal CP is low. Also, the input data D at the input terminal TXin is expected to change on the rising edge of the secondary clock signal CP.

The output terminal TXout is evaluated equal to ground GND when an input data D equal to '0' has been latched on the internal node INTnode during a precharge phase. Otherwise, a precharge positive value is kept on the output terminal TXout.

The two feedback transistors of the hold block 22, the fourth PMOS transistor P4 and the second NMOS transistor N2, confirm the evaluation levels on the internal node INTnode and on the output terminal TXout.

The preset signal SD, which is active-high, forces a discharge on the internal node INTnode, keeping the fourth NMOS transistor N4 of the evaluation block 19 switched off so that the output terminal TXout remains high.

Out of a preset phase corresponding to a high value of the preset signal SD, the third NMOS transistor N3 is off and the first PMOS transistor P1 is always on.

Advantageously according to an embodiment of the invention, the transistor sizing is accomplished in order to optimize a critical path consisting of the discharge of the output node TXout. This critical path comprises the sequence of transistors P1-P2-P3 plus N4-N5, whereas a minimum size is enough for the transistors P4 and N3. Also, the sizing of the transistor P5 of the precharge block 18 guarantees a quick switching to the precharge phase.

It is desirable to prevent the output node TXout and the internal node INTnode from being affected by undesired discharge due to leakage current during the evaluation phase, i.e. when the internal node INTnode can be in high impedance (Hi-Z). For this reason, according to a preferred embodiment of the transmitter TX 11, the third P3 and fourth PMOS transistors P4, as well as the third N3 and fourth NMOS transistors N4 are high-threshold MOSFET transistors. These transistors are in fact inserted on critical branches leading to the internal node INTnode.

More precisely, when the input data D changes to a logic '0' still in the evaluation phase, the internal node INTnode is driven to a high impedance (Hi-Z) condition and the fourth NMOS transistor N4 of the evaluation block 19 is switched off as the precharged value is to be kept on the output terminal TXout.

Moreover, the third P3 and fourth PMOS transistors P4, being high threshold transistors, prevent that a leakage current partially charges the internal node INTnode and leads to an unwanted switch-on of the fourth NMOS transistor N4, thus altering the output value at the output terminal TXout.

In particular, according to embodiments of the invention, the following phases are advantageously performed:
  precharge phase: the preset signal SD has a high logic value (SD='1') In case of a first precharging, the output terminal TXout also changes to a high logic value (TXout='1') when the secondary clock signal CP has a low logic value (CP='0'), this precharging being synchronous.
  evaluation phase: the preset signal SD has a low logic value (SD='0') In this case, if the secondary clock signal CP also has a low logic value (CP='0'), the output terminal TXout is raised up to a high logic value (TXout='1'), independently from a value of the input data D.
  Otherwise, if the secondary clock signal CP raises up to a high logic value (CP='0'->'1'—rising edge of the secondary clock signal CP), the output terminal TXout is charged according to the input data D, and particularly:

if the input data D has a high logic value (D='1'), the output terminal TXout is left unchanged to the precharging high logic value (TXout='1');

if the input data D has a low logic value (D='0'), the output terminal TXout is evaluated to a low logic value (TXout='0'), thus transmitting a falling edge to the inter-chip communication channel 25 connecting the transmitter 11 to the receiver 12.

Figure 4A:
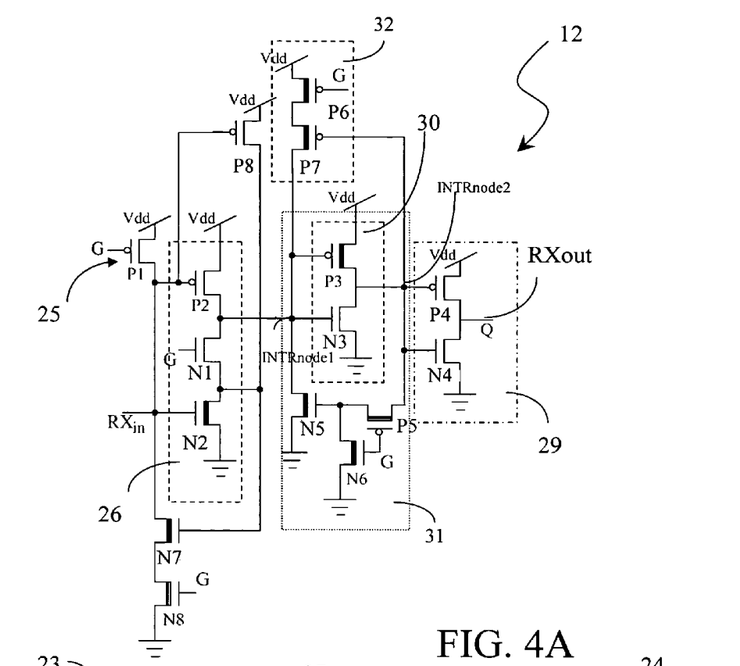
FIGS. 4A and 4B schematically show a receiver comprised in the system according to an embodiment of the present invention (possible electric implementation and general purpose block diagrams, respectively)
Figure 4B:
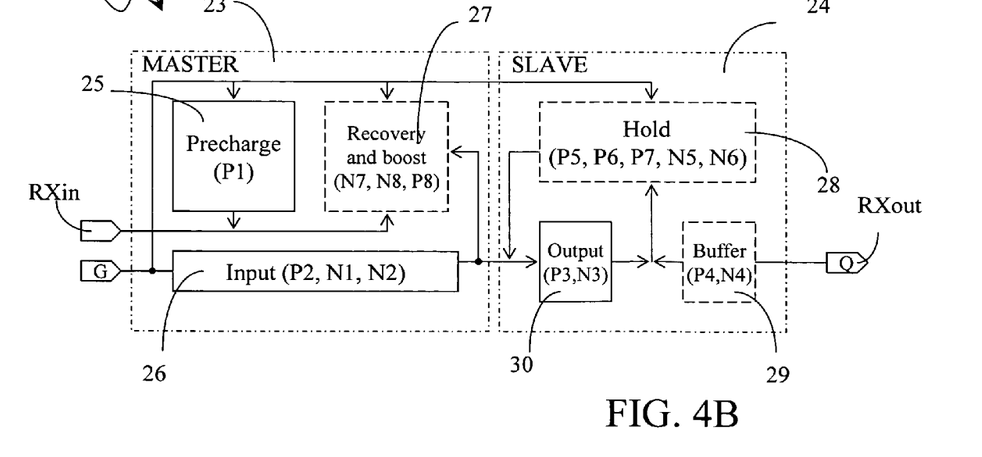

The receiver RX 12 according to an embodiment of the present invention is shown in greater detail in FIGS. 4A and 4B.

In particular, referring to the schematic form of FIG. 4B, the receiver RX 12 comprises a master section 23 and a slave section 24, connected, in cascade to each other, between the input terminal RXin and the output terminal RXout, the master section 16 also receiving the primary clock signal G.

Advantageously according to an embodiment of the invention, the master section 23 comprises a precharge block 25 connected to the primary clock terminal G and to an input block 26, in turn connected to the primary clock terminal G and to the slave section 24, in particular to an output block 30 thereof.

The output block 30 of the slave section 24 is in turn connected to the output terminal RXout of the receiver RX 12.

In the receiver RX 12 according to a preferred embodiment of the present invention, the master section 23 also comprises a recovery and boost block 27 connected to the primary clock terminal G, to the input terminal RXin and to the input block 26.

In particular, the recovery and boost block 27 guarantees a correct working in case of reduced inter-chip capacitive coupling, as well as to speed the evaluation of the receiver RX 12, avoiding additional power consumption due to paths of static current.

According to yet another preferred embodiment of the present invention, the slave section 24 of the receiver RX 12 further comprises a hold block 28 connected in loop to the output block 30 as well as to the primary clock terminal G. As for the transmitter TX 11, the hold block 28 guarantees the correct working of the receiver RX 12 also at very low frequencies (up to DC values).

According to a further preferred embodiment of the present invention, the slave section 24 of the receiver RX 12 further comprises a buffer block 29 connected between the output block 30 and the output terminal RXout of the receiver RX 12. The buffer block 29 allows the receiver RX 12 to drive very high capacitive loads.

FIG. 4A shows an implementation of the receiver RX 12 of FIG. 4B.

The receiver RX 12 comprises a first PMOS transistor P1, inserted between the supply voltage reference Vdd and the input terminal RXin and having a control terminal connected to the primary clock terminal G. In this way, the first PMOS transistor P1 forms the precharge block 25 of the master section 23 of the receiver RX 12.

The receiver RX 12 also comprises a second PMOS transistor P2, a first N1 and a second NMOS transistors N2 inserted, in series to each other, between the supply voltage reference Vdd and ground GND, the second PMOS transistor P2 and the second NMOS transistor N2 having their control terminals connected to the input terminal RXin, while the first NMOS transistor N1 has a control terminal connected to the primary clock terminal G.

The second PMOS transistor P2 and the first NMOS transistor N1 are interconnected at a first internal node INTRnode1.

In this way, the second PMOS transistor P2 as well as the first N1 and second NMOS transistors N2 form the input block 26 of the master section 23 of the receiver RX 12.

Furthermore, the receiver RX 12 comprises a third PMOS transistor P3 and a third NMOS transistor N3 connected, in series to each other, between the voltage supply reference Vdd and ground GND and having their control terminals connected to the first internal node INTRnode1.

The third PMOS transistor P3 and the third NMOS transistor N3 are interconnected at a second internal node INTRnode2.

In this way the third PMOS transistor P3 and the third NMOS transistor N3 form the output block 30 of the slave section 24 of the receiver RX 12.

The receiver RX 12 also comprises a fourth PMOS transistor P4 and a fourth NMOS transistor N4 connected, in series to each other, between the voltage supply reference Vdd and ground GND and having their control terminals connected to the second internal node INTRnode2.

The fourth PMOS transistor P4 and a fourth NMOS transistor N4 are interconnected at the output terminal RXout of the receiver RX 12.

In this way, the fourth PMOS transistor P4 and the fourth NMOS transistor N4 form the buffer block 29 of the slave section 24 of the receiver RX 12.

Moreover, the receiver RX 12 comprises a fifth NMOS transistor N5 inserted between the first internal node INTRnode1 and ground GND and having a control terminal connected to a first conductive terminal of a fifth PMOS transistor P5, having in turn a second conductive terminal connected to the second internal node INTRnode2 and a control terminal connected to a control terminal of a sixth NMOS transistor N6. The sixth NMOS transistor N6 is inserted between the control terminal of the fifth NMOS transistor N5 and ground GND.

Also, the receiver RX 12 comprises a sixth P6 and a seventh PMOS transistor P7 inserted, in series to each other, between the supply voltage reference Vdd and the first internal node INTRnode1. The sixth PMOS transistor P6 has a control terminal connected to the primary clock terminal G and the seventh PMOS transistor P7 has a control terminal connected to the second internal node INTRnode2.

In this way, the fifth P5, sixth P6 and seventh PMOS transistor P7 as well as the fifth N5 and sixth NMOS transistor N6 form the hold block 28 of the slave section 24 of the receiver RX 12. In particular, the sixth P6 and seventh PMOS transistors P7 form a feedback branch 32.

Finally, the receiver RX 12 comprises a seventh N7 and a eighth NMOS transistor N8 inserted, in series to each other, between the input terminal RXin of the receiver RX 12 and ground GND, the eighth NMOS transistor N8 having a control terminal connected to the primary clock terminal G, as well as a eighth PMOS transistor P8 inserted between the supply voltage reference Vdd and a control terminal of the seventh NMOS transistor N7, the eighth PMOS transistor P8 having a control terminal connected to the control terminal of the second PMOS transistor P2 and thus to the input terminal RXin.

In this way, the seventh N7 and eighth NMOS transistor N8 as well as the eighth PMOS transistor P8 form the input block 26 of the master section 23 of the receiver RX 12.

In a preferred embodiment of the present invention, the second N2, fifth N5, sixth N6, seventh N7 and eighth NMOS transistors N8 as well as the third P3, fifth P5, sixth P6 and seventh PMOS transistors P7 are high-threshold MOSFET transistors, used to reduce the injection of leakage current, while the first N1, third N3 and fourth NMOS transistors N4 as well as the first P1, second P2, fourth P4 and eighth PMOS transistors P8 are low-threshold MOSFET transistors, used to high speed communication.

Advantageously according to an embodiment of the invention, the receiver RX 12 has been implemented according to a dynamic technique related to the transmitter TX 11 timing, where the input terminal RXin is precharged when the primary clock signal G is low. In this way, a variation of the signal applied to the input terminal RXin is expected to occur only during the evaluation phase.

During the precharge phase, the feedback loop formed by the fifth PMOS P5 and the sixth NMOS transistor N6 of the hold block 28 is switched on so that even a reduced charge injection received from the third PMOS transistor P3 of the output block 30 on the second internal node INTRnode2 allows to switch on the fifth NMOS transistor N5 of the hold block 28. In this way, the fifth NMOS transistor N5 keeps the control terminal of the third NMOS transistor N3, which is a pull down transistor, to the value of the first internal node INTRnode1.

In this precharge phase, both the second PMOS transistors P2 and the first NMOS transistor N1 of the receiver RX 12 are switched off so that they do not disturb the loop of the transistors P5 and N6.

During the evaluation phase, the input block 26—formed by the second PMOS transistor P2 and by the first N1 and second NMOS transistors N2—acts as an inverter so that the first internal node INTRnode1 shows in a mirrored manner an inverted value with respect to an input signal of the input terminal RXin.

Also, the feedback loop of the transistors P5 and N6 is disabled so that the charge of the first internal node INTRnode1 is not disturbed in this phase.

Figure 5A:
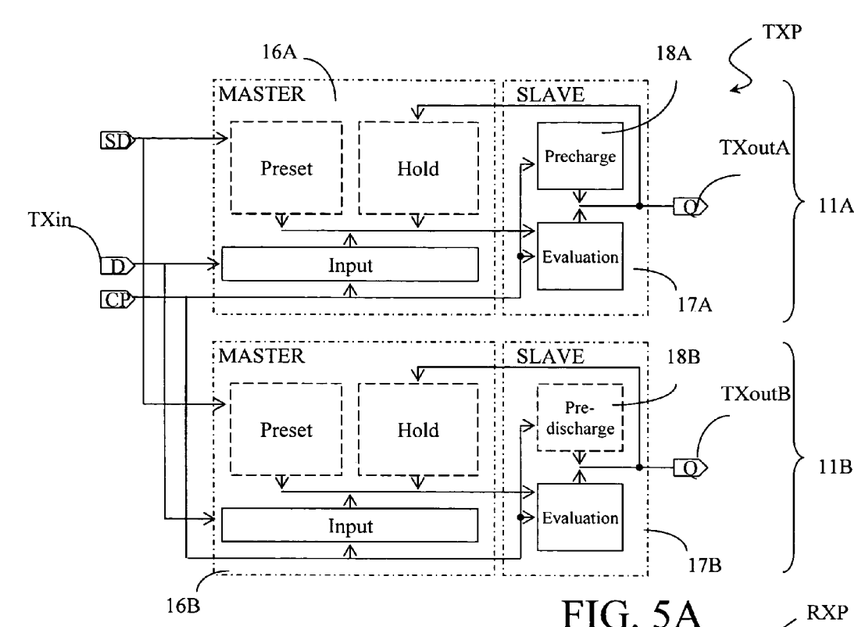
FIGS. 5A and 5B schematically show the principle of operation of the transmitter and receiver of a two-channel transmission system according to an embodiment of the present invention.
Figure 5B:
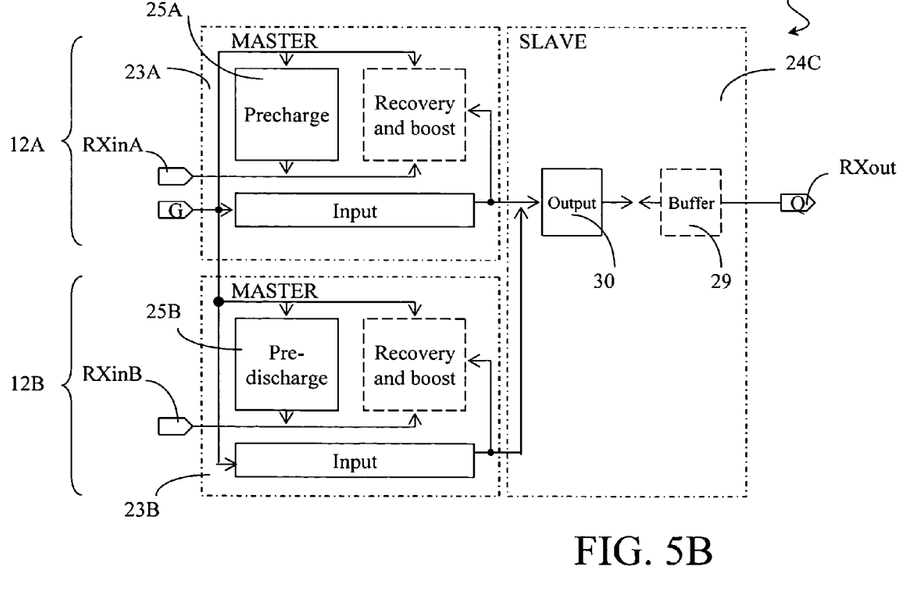

Advantageously according to an embodiment of the invention, a two-channel transmission system 10 able to transmit and receive signals at both the clock signal phases is obtained and shown in FIGS. 5A and 5B.

In particular, as shown in FIG. 5A, the two-channel transmission system 10 comprises a first or transmission portion TXP, in turn including at least a first 11A and a second transmitter TX 11B, each requiring a dedicated communication channel for each output terminal. In particular, the master sections 16A and 16B of the transmitters TX 11A and 11B share a common input terminal TXin and a secondary clock terminal CP, while the slave sections 17A and 17B have respective output terminals TXoutA and TXoutB.

It should be noted that the transmitters TX 11A and 11B are in complementary configurations, a precharging configuration and a predischarging one, respectively, and thus active on the positive and negative edges of the clock signal, respectively, i.e., on low and high phases of the clock signal. In this aim, the first transmitter TX 11A comprises a precharge block 18A and the second transmitter TX 11 B comprises a predischarge block 18B.

In a dual manner, as shown in FIG. 5B, the two-channel transmission system 10 comprises a second or receiving portion RXP in turn including at least a first 12A and a second receiver RX 12B, having respective master sections 23A and 23B and a common slave section 24C. The master sections 23A and 23B have a first RXinA and second input terminal RXinB, respectively, while the common slave section 24C has a single output terminal RXout.

In particular, the receivers RX 12A and 12B are in complementary configurations, a precharging configuration and a predischarging one, respectively, and thus active on the positive and negative edges of the clock signal, respectively. In this aim, the first receiver RX 12A comprises a precharge block 25A and the second receiver RX 12B comprises a predischarge block 25B.

Moreover, in this case, advantageously according to one embodiment of the invention, the buffer block 29 and the output block 30 of the common slave section 24C are shared by the receivers RX 12A and 12B, the hold block 28 being no longer needed since the evaluation phases of the receivers RX 12A and 12B are complementary in terms of clock phases and the internal nodes INTRnode1 and INTRnode2 of the receivers RX 12A and 12B are never in a high impedance condition.

So, advantageously according to embodiments of the invention, the system 10 can operate at a double working frequency with respect to a known transmission system.

As previously explained, the transmitter TX 11 and receiver RX 12 of the communication system 10 according to embodiments of the present invention can be coupled in a capacitive channel fashion as well as in an ohmic channel fashion, as shown in FIGS. 2A and 2B and in another suitable fashion as well.

In particular, it should be noted that, advantageously according to embodiments of the present invention, only one clock channel is necessary for an n-wide inter-chip bus, thus resulting a negligible overhead for the channel count.

From the foregoing it will be appreciated that, although specific embodiments of the invention have been described herein for purposes of illustration, various modifications may be made without deviating from the spirit and scope of the invention.

The invention claimed is:

1. A chip-to-chip communication system, comprising a transmitter housed in a first integrated circuit chip and a receiver housed in a second integrated circuit chip, the transmitter and receiver being connected to respective transmitter and receiver clock terminals wherein respective transmitter and receiver clock signals are applied, the transmitter having an input terminal receiving input data and an output terminal connected to an input terminal of the receiver at a capacitive connection block, the receiver having an output terminal issuing an output signal, wherein:

the transmitter comprises a first precharge block and an evaluation block connected to each other and to the transmitter clock terminal;

the receiver comprises a second precharge block connected to the receiver clock terminal;

the first and second precharge blocks are operable to precharge the output terminal of the transmitter and the input terminal of the receiver, respectively, to a value corresponding to a first reference voltage during a low phase of the transmitter clock signal; and the transmitter and receiver clock signals are obtained by a common clock signal, the input data and the transmitter and receiver clock signals flowing in opposite directions between the transmitter and the receiver.

2. The system according to claim 1, wherein the transmitter comprises a master section and a slave section, connected, in cascade to each other, between the input terminal and the output terminal, both connected to the transmitter clock terminal, the slave section comprising the first precharge block and evaluation block.

3. The system according to claim 1, wherein the first precharge block comprises a transistor inserted between the first reference voltage and the output terminal and has a control terminal connected to the transmitter clock terminal.

4. The system according to claim 3, wherein a first transistor of the evaluation block, a second transistor of the input block, a second transistor of the hold block and a second transistor of the preset block are high-threshold MOSFET transistors.

5. The system according to claim 3, wherein a second transistor of the evaluation block, first and second transistors of the input block, a first transistor of the hold block and a first transistor of the preset block are low-threshold MOSFET transistors.

6. The system according to claim 1, wherein the evaluation block of the transmitter comprises first and second transistors inserted, in series, between the output terminal and a second reference voltage, the first transistor having a control terminal connected to an internal node, said internal node being connected to the input terminal, and the second transistor having a control terminal connected to the transmitter clock terminal.

7. The system according to claim 1, wherein the receiver comprises a master section and a slave section, connected, in cascade to each other, between the input terminal and the output terminal, the master section comprising the precharge block.

8. The system according to claim 7, wherein the master section and the slave section are both connected to the receiver clock terminal.

9. The system according to claim 7, wherein the master section further comprises an input block connected to the receiver clock terminal and to the slave section.

10. The system according to claim 9, wherein the slave section of the receiver comprises an output block connected to the input block of the master section and to the output terminal of the receiver.

11. A chip-to-chip communication system, comprising a transmitter housed in a first integrated circuit chip and a receiver housed in a second integrated circuit chip, the transmitter and receiver being connected to respective transmitter and receiver clock terminals wherein respective transmitter and receiver clock signals are applied, the transmitter having an input terminal receiving input data and an output terminal connected to an input terminal of the receiver at a capacitive connection block, the receiver having an output terminal issuing an output signal, wherein:
 the transmitter comprises a first precharge block and an evaluation block connected to each other and to the transmitter clock terminal;
 the receiver comprises a second precharge block connected to the receiver clock terminal;
 the first and second precharge blocks are operable to precharge the output terminal of the transmitter and the input terminal of the receiver, respectively, to a value corresponding to a first reference voltage during a low phase of the transmitter clock signal;
 the transmitter comprises a master section and a slave section, connected, in cascade to each other, between the input terminal and the output terminal, both connected to the transmitter clock terminal, the slave section comprising the first precharge block and evaluation block; and
 wherein the master section of the transmitter is also connected to a preset terminal wherein a preset signal is applied.

12. The system according to claim 11, wherein the first precharge block and evaluation block of the slave section of the transmitter are connected to the transmitter clock terminal and to the output terminal.

13. The system according to claim 12, wherein the output terminal is also connected in a feedback manner to the master section of the transmitter.

14. The system according to claim 11, wherein the master section of the transmitter further comprises an input block connected to the input terminal and to the evaluation block of the slave section of the transmitter, the input block being also connected to the transmitter clock terminal.

15. The system according to claim 14, wherein the master section of the transmitter further comprises a hold block connected to the input block as well as to the evaluation block of the slave section of the transmitter.

16. The system according to claim 15, wherein the hold block of the master section of the transmitter comprises a first and second transistors, the first transistor being inserted between the input block and the second reference voltage and having a control terminal connected to the output terminal and the second transistor being inserted between the first reference voltage and an internal node and having a control terminal connected to the output terminal.

17. The system according to claim 14, wherein the input block of the master section of the transmitter comprises first, second and third transistors inserted in series between first and second reference voltages, the first and third transistors having respective control terminals connected to the input terminal and the second transistor having a control terminal connected to the transmitter clock terminal, the second and third transistors being interconnected at an internal node.

18. A chip-to-chip communication system, comprising a transmitter housed in a first integrated circuit chip and a receiver housed in a second integrated circuit chip, the transmitter and receiver being connected to respective transmitter and receiver clock terminals wherein respective transmitter and receiver clock signals are applied, the transmitter having an input terminal receiving input data and an output terminal connected to an input terminal of the receiver at a capacitive connection block, the receiver having an output terminal issuing an output signal, wherein:
 the transmitter comprises a first precharge block and an evaluation block connected to each other and to the transmitter clock terminal;
 the receiver comprises a second precharge block connected to the receiver clock terminal;
 the first and second precharge blocks are operable to precharge the output terminal of the transmitter and the input terminal of the receiver, respectively, to a value corresponding to a first reference voltage during a low phase of the transmitter clock signal;
 the transmitter comprises a master section and a slave section, connected, in cascade to each other, between the input terminal and the output terminal, both connected to the transmitter clock terminal, the slave section comprising the first precharge block and evaluation block;
 wherein the master section of the transmitter is also connected to a preset terminal wherein a preset signal is applied; and
 wherein the master section of the transmitter further comprises a preset block connected to the preset terminal and to the evaluation block of the slave section of the transmitter, as well as to an input block of the master section of the transmitter.

19. The system according to claim 18, wherein the preset block of the transmitter comprises first and second transistors, the first transistor being inserted between the first reference voltage and the input block and having a control terminal connected to the preset terminal, the second transistor being inserted between an internal node and a second reference voltage and having a control terminal connected to the preset terminal.

20. A chip-to-chip communication system, comprising a transmitter housed in a first integrated circuit chip and a receiver housed in a second integrated circuit chip, the transmitter and receiver being connected to respective transmitter and receiver clock terminals wherein respective transmitter and receiver clock signals are applied, the transmitter having an input terminal receiving input data and an output terminal connected to an input terminal of the receiver at a capacitive connection block, the receiver having an output terminal issuing an output signal, wherein:

the transmitter comprises a first precharge block and an evaluation block connected to each other and to the transmitter clock terminal;

the receiver comprises a second precharge block connected to the receiver clock terminal;

the first and second precharge blocks are operable to precharge the output terminal of the transmitter and the input terminal of the receiver, respectively, to a value corresponding to a first reference voltage during a low phase of the transmitter clock signal; and the receiver comprises a master section and a slave section, connected, in cascade to each other, between the input terminal and the output terminal, the master section comprising:

the precharge block, an input block connected to the receiver clock terminal and to the slave section, and a recovery and boost block connected to the receiver clock terminal, to the input terminal and to the input block.

21. The system according to claim 20, wherein the input block of the master section of the receiver comprises a first, second and third transistors inserted, in series to each other, between the first and second reference voltages, the first and third transistors having their control terminals connected to the input terminal of the receiver, while the second transistor has a control terminal connected to the receiver clock terminal, the first and second transistors being interconnected at a first internal node.

22. The system according to claim 20, wherein recovery and boost block of the master section of the receiver comprises first, second and third transistors, the first and second transistors being inserted in series between the input terminal of the receiver and a second reference voltage, the second transistor having a control terminal connected to the receiver clock terminal, the third transistor being inserted between the first reference voltage and a control terminal of the first transistor and having a control terminal connected to the input terminal of the receiver.

23. A chip-to-chip communication system, comprising a transmitter housed in a first integrated circuit chip and a receiver housed in a second integrated circuit chip, the transmitter and receiver being connected to respective transmitter and receiver clock terminals wherein respective transmitter and receiver clock signals are applied, the transmitter having an input terminal receiving input data and an output terminal connected to an input terminal of the receiver at a capacitive connection block, the receiver having an output terminal issuing an output signal, wherein:

the transmitter comprises a first precharge block and an evaluation block connected to each other and to the transmitter clock terminal;

the receiver comprises a second precharge block connected to the receiver clock terminal;

the first and second precharge blocks are operable to precharge the output terminal of the transmitter and the input terminal of the receiver, respectively, to a value corresponding to a first reference voltage during a low phase of the transmitter clock signal; and the receiver comprises a master section and a slave section, connected, in cascade to each other, between the input terminal and the output terminal, wherein the master section comprises the precharge block and an input block connected to the receiver clock terminal and to the slave section, and wherein the slave section of the receiver comprises an output block connected to the input block of the master section and to the output terminal of the receiver, and further comprises a hold block connected in loop to the output block as well as to the receiver clock terminal.

24. The system according to claim 23, wherein the slave section of the receiver further comprises a buffer block connected between the output block and the output terminal of the receiver.

25. The system according to claim 24, wherein the buffer block of the slave section of the receiver comprises a first and second transistors connected, in series to each other, between the first and second reference voltages and having their control terminals connected to a second internal node, the first and second transistors being interconnected at the output terminal of the receiver.

26. The system according to claim 23, wherein the precharge block of the receiver comprises a transistor, inserted between the first reference voltage and the input terminal of the receiver and having a control terminal connected to the receiver clock terminal.

27. The system according to claim 26, wherein a third transistor of an input block, a first, second, third, fourth and fifth transistors of a hold block, first and second transistors of a recovery and boost block and a first transistor of an output block are high-threshold MOSFET transistors.

28. The system according to claim 26, wherein first and second transistors of an input block, a second transistor of an output block, first and second transistors of a buffer block, the transistor of the precharge block and a third transistor of a recovery and boost block are low-threshold MOSFET transistors.

29. The system according to claim 23, wherein the output block of the slave section of the receiver comprises first and second transistors connected, in series to each other, between the first and second reference voltages and having their control terminals connected to a first internal node, the first and second transistors being interconnected at a second internal node.

30. The system according to claim 23, wherein the hold block of the slave section of the receiver comprises a first, second, third, fourth and fifth transistors, the fifth transistor inserted between a first internal node and the second reference voltage and having a control terminal connected to a first conductive terminal of the first transistor, having in turn a second conductive terminal connected to a second internal node and a control terminal connected to a control terminal of a sixth transistor, the sixth transistor being inserted between the control terminal of the fifth transistor and the second reference voltage, the second and third transistors being inserted, in series to each other, between the first reference voltage and a first internal node, the second transistor having a control terminal connected to the receiver clock terminal and the third transistor having a control terminal connected to the second internal node.

31. The system according to claim 30, wherein the second and third transistors form a feedback branch of the receiver.

32. A chip-to-chip communication system, comprising a transmitter and a receiver inserted between first and second voltage references and connected to respective transmitter and receiver clock terminals wherein respective transmitter and receiver clock signals are applied, the transmitter having an input terminal receiving an input data and an output terminal connected to an input terminal of the receiver at a connection block, the receiver having an output terminal issuing an output signal, wherein:

the transmitter comprises at least a precharge and an evaluation blocks connected to each other and to the transmitter clock terminal;

the receiver comprises at least a precharge block connected to the receiver clock terminal;

the precharge blocks are operable to precharge the output terminal of the transmitter and the input terminal of the receiver, respectively, to a value corresponding to a first voltage reference during a low phase of the transmitter clock signal; and the system is a two-channel transmission system able to transmit and receive signals at both low and high clock signals phases and in that it comprises:

a first transmission portion, in turn including at least a first and a second transmitters, which are in precharging and predischarging configurations, respectively, and are respectively active on low and high phases of said transmitter clock signal, and a second receiving portion, in turn including at least a first and a second receivers, which are in precharging and predischarging configurations, respectively, and are respectively active on low and high phases of said receiver clock signal.

33. The system according to claim 32, wherein said first transmitter of said first transmission portion comprises a precharge block and said second transmitter of said first transmission portion comprises a predischarge block.

34. The system according to claim 33, wherein each of said first and second transmitters of said first transmission portion requires a dedicated communication channel for each output terminal.

35. The system according to claim 33, wherein said first and second transmitters of said first transmission portion comprises respective master sections sharing a common input terminal and said transmitter clock terminal.

36. The system according to claim 35, wherein said first and second transmitters of said first transmission portion comprises respective slave sections having respective output terminals.

37. The system according to claim 32, wherein said first receiver of said second receiving portion comprises a precharge block and said second receiver of said second receiving portion comprises a predischarge block.

38. The system according to claim 37, wherein said first and second receivers have respective master sections in turn having a first and second input terminals and a common slave section, having in turn a single output terminal.

39. The system according to claim 38, wherein said first and second receivers shares a buffer block and an output block of said common slave section.

40. A method of communicating data from a first chip to a second chip, with the first chip including a transmitter having an output node and the second chip including a receiver having an input node, the method comprising:

generating a first clock signal on the second chip;

transferring the first clock signal in a first direction from the second chip to the first chip to generate a second clock signal on the first chip;

applying the first clock signal to the receiver;

applying the second clock signal to the transmitter;

precharging the input node of the receiver responsive to the first clock signal;

precharging the output node of the transmitter responsive to the second clock signal;

initiating an evaluation phase of the receiver responsive to the first clock signal;

initiating an evaluation phase of the transmitter responsive to the second clock signal; and under control of the second clock signal, transmitting data in a second direction from the transmitter on the first chip to the receiver on the second chip after initiating the evaluation phase of the receiver.

41. The method of claim 40, wherein the first chip is connected to a first reference voltage and a second reference voltage, the second chip is connected to the first reference voltage and a third reference voltage, and the second and third reference voltages have respective magnitudes that are substantially different from one another.

42. The method of claim 40, wherein the operations of precharging occur during a particular logic state of the second clock signal.

43. The method of claim 42, wherein the particular logic state is the low state of the second clock signal.

44. The method of claim 40, wherein transferring the first clock signal in a first direction from the second chip to the first chip to generate a second clock signal on the first chip comprises capacitively coupling the first clock signal on the second chip to the first chip to develop the second clock signal on the first chip.

45. The method of claim 40, wherein transferring the first clock signal in a first direction from the second chip to the first chip to generate a second clock signal on the first chip comprises ohmicly coupling the first clock signal on the second chip to the first chip to develop the second clock signal on the first chip.

* * * * *